US006714015B2

(12) United States Patent
Whitehead

(10) Patent No.: US 6,714,015 B2
(45) Date of Patent: Mar. 30, 2004

(54) APPARATUS FOR TESTING SPARK PLUGS

(75) Inventor: Michael L. Whitehead, Clarinda, IA (US)

(73) Assignee: Lisle Corporation, Clarinda, IA (US)

( * ) Notice: Subject to any disclaimer, the term of this patent is extended or adjusted under 35 U.S.C. 154(b) by 0 days.

(21) Appl. No.: 10/133,799

(22) Filed: Apr. 26, 2002

(65) Prior Publication Data

US 2003/0201776 A1 Oct. 30, 2003

(51) Int. Cl.$^{7}$ .................................................. G01R 31/02
(52) U.S. Cl. ...................... 324/378; 324/72.5; 324/538; 439/668; 439/669; 439/910
(58) Field of Search ........................ 123/169 R, 169 EL, 123/169 EB; 439/668, 669, 910, 490; 324/72.5, 378, 380, 384, 393, 399, 400, 402, 149, 538; 340/654

(56) References Cited

U.S. PATENT DOCUMENTS 3,979,664 A * 9/1976 Harris ........................ 324/397
4,041,380 A * 8/1977 Epstein ....................... 324/556

OTHER PUBLICATIONS

Invention Disclosure Agreement; Richard Gossen; Ignition Tester; Oct. 12, 1983.
Invention Disclosure Agreement Victor Gontreras; Spark Tester; Feb. 12, 1988.
Invention Disclosure Agreement; Neal P. Rowell, Sr., Ph. D.; Ignition Tester; May 2, 1988.
Invention Disclosure Agreement Jamie A. Chan; Engine Coil Spark Tester Light; Apr. 26,1990.
Invention Disclosure Agreement; Mickey Rogers; Q.C. Plugs (quick–check); Sep. 4, 1994.
Invention Disclosure Agreement; Jeffrey E. Feather; Spark Plug Wire to Visually Check for Spark; Aug. 26, 1995.

* cited by examiner

*Primary Examiner*—N. Le
*Assistant Examiner*—Vincent Q. Nguyen
(74) *Attorney, Agent, or Firm*—Banner & Witcoff, Ltd.

(57) ABSTRACT

A tool for determining the continuity of an electrical circuit for an internal combustion engine includes a single body member with male connectors projecting from the opposite ends and a lead wire having a 90° connection boot at one end and an inline connection boot at the opposite end is useful for attachment to the heads of spark plugs regardless of their orientation in an engine block.

5 Claims, 4 Drawing Sheets

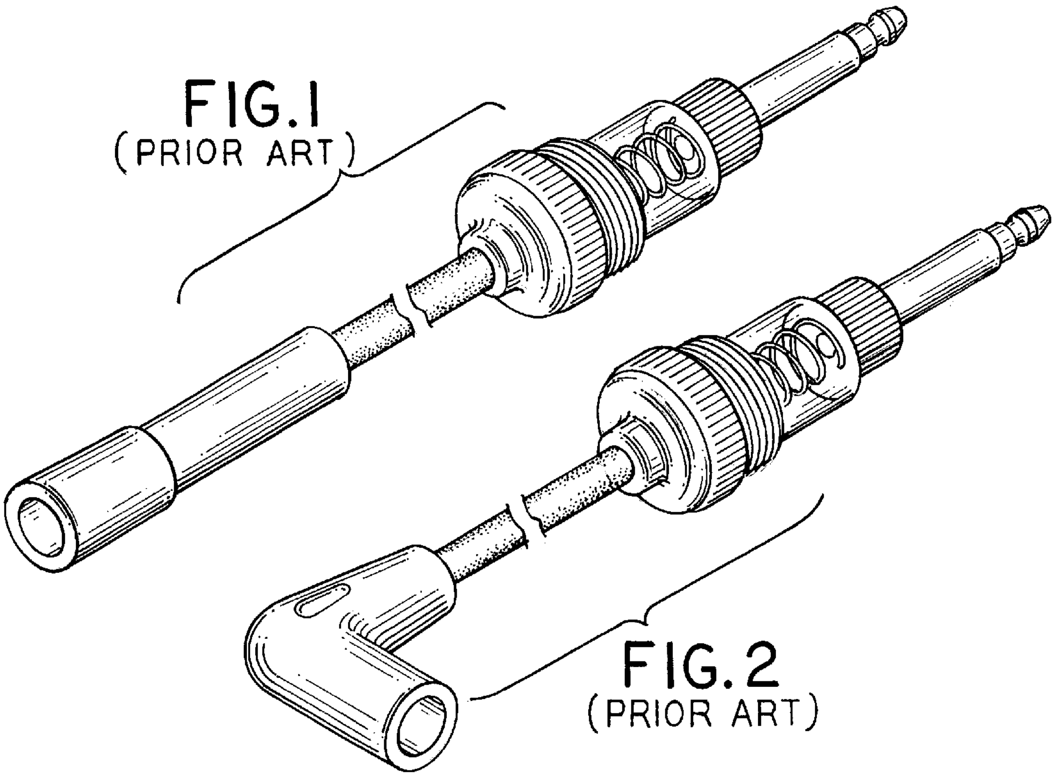
FIG. 1
(PRIOR ART)
FIG. 2
(PRIOR ART)
FIG. 3
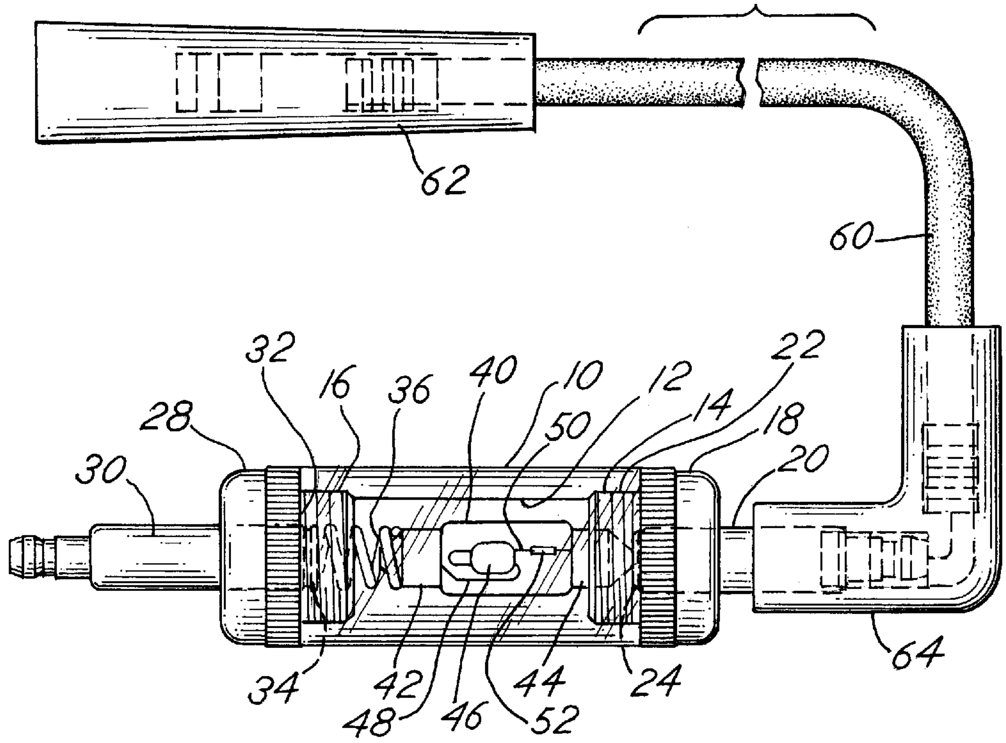

APPARATUS FOR TESTING SPARK PLUGS

BACKGROUND OF THE INVENTION

In a principal aspect, the present invention relates to an apparatus for determining whether the spark plug of an internal combustion engine is properly generating an ignition spark or electrical discharge so as to ignite vaporized fuel.

When servicing an internal combustion engine, a mechanic often finds it necessary to determine whether the spark plugs for the engine are providing an appropriate electrical discharge or spark in each of the cylinders of the engine. A determination of ignition spark enables the mechanic to diagnose whether engine operation is defective due to a faulty ignition system or alternatively, due to a faulty fuel delivery system. That is, by determining whether appropriate electrical charge or spark is delivered via the spark plug of the internal combustion engine, the mechanic quickly and easily determines that the ignition system is working properly. Thus, if the spark is generated, then there may be a defect associated with the fuel delivery system. Alternatively, if there is no spark, then the ignition system is not working properly.

There are at least two devices known which are used to check the viability of the ignition system. These devices are made available by S&G Tool Aid Corporation of Newark, N.J. Their product numbers are No. 23900 and No. 23920 and are depicted in FIGS. 1 and 2, respectively. Product No. 23900 is identified as an inline ignition spark checker and includes a male contact or probe connected in a circuit with a light indicator. The male probe projects from one end of the device. An inline boot or lead wire for connection to the head of a spark plug is provided at the opposite end of the device. Product No. 23920 is an alternative construction wherein the boot or lead wire is a 90° boot designed for use in situations where the inline boot will not be useful or workable. Thus, in order to check the spark at each and every cylinder of a multi-cylinder internal combustion engine, it may be necessary to use both tools, depending upon the orientation and position of the spark plug in the engine block. A mechanic may necessarily need to switch back and forth between tools in order to check the ignition system associated with each of the cylinders of an internal combustion engine. Such switching back and forth, as well as the cost of two tools to perform the same function, has inspired the development of the present invention.

SUMMARY OF THE INVENTION

Briefly, the present invention comprises an apparatus or mechanic's tool for evaluating the ignition system, and more particularly, the delivery of electrical current via the ignition system to a spark plug of an internal combustion engine. The tool has universal application in that the tool utilizes either an inline boot for connection to the head of the spark plug or an angled, i.e. 90° boot, depending upon the requisite need and accessibility of the spark plug associated with the internal combustion engine that is being serviced.

Thus, the tool includes a lead wire having an inline female boot at one end and a 90° connection boot at its opposite end. The tool further includes a generally cylindrical body member with male connectors screw-threaded to each end of the body member. Internally, the body member is hollow and includes an indicator light in series with the male connectors projecting from the opposite ends of the body member into the hollow cylindrical body member. A spring inside the body member is interposed between the light and the male connectors to insure electrical continuity for the device. A lead wire boot may be connected to either of the male connectors projecting from the body member and may also be connected at either end to the head of a spark plug. Thus, the single tool disclosed may be utilized for inline or angle connection of the tool to the head of a spark plug and thereby provide a continuity check of the ignition system.

Thus, it is an object of the invention to provide an improved ignition system diagnostic tool.

It is a further object of the invention to provide an ignition system diagnostic tool which may be utilized for checking an electrical spark via a spark plug in an ignition system regardless of the orientation or position of the head of the spark plug in the engine block.

It is a further object of the present invention to provide a diagnostic tool for ignition systems which is inexpensive, rugged, easy to use, has broad application for various types of engines and spark plugs associated with such engines, and which is lightweight and inexpensive.

These and other objects, advantages and features of the invention will be set forth in the detailed description as follows.

BRIEF DESCRIPTION OF THE DRAWING

In the detailed description which follows, reference will be made to the drawing comprised of the following figures:

FIG. 1 is an isometric view of a prior art tool having a linear or straight line connection boot;

FIG. 2 is an isometric view of a second prior art tool having a 90° or right angle connection boot;

FIG. 3 is a plan view of the diagnostic tool of the invention;

DESCRIPTION OF THE PREFERRED EMBODIMENT

Figures 4, 4A:
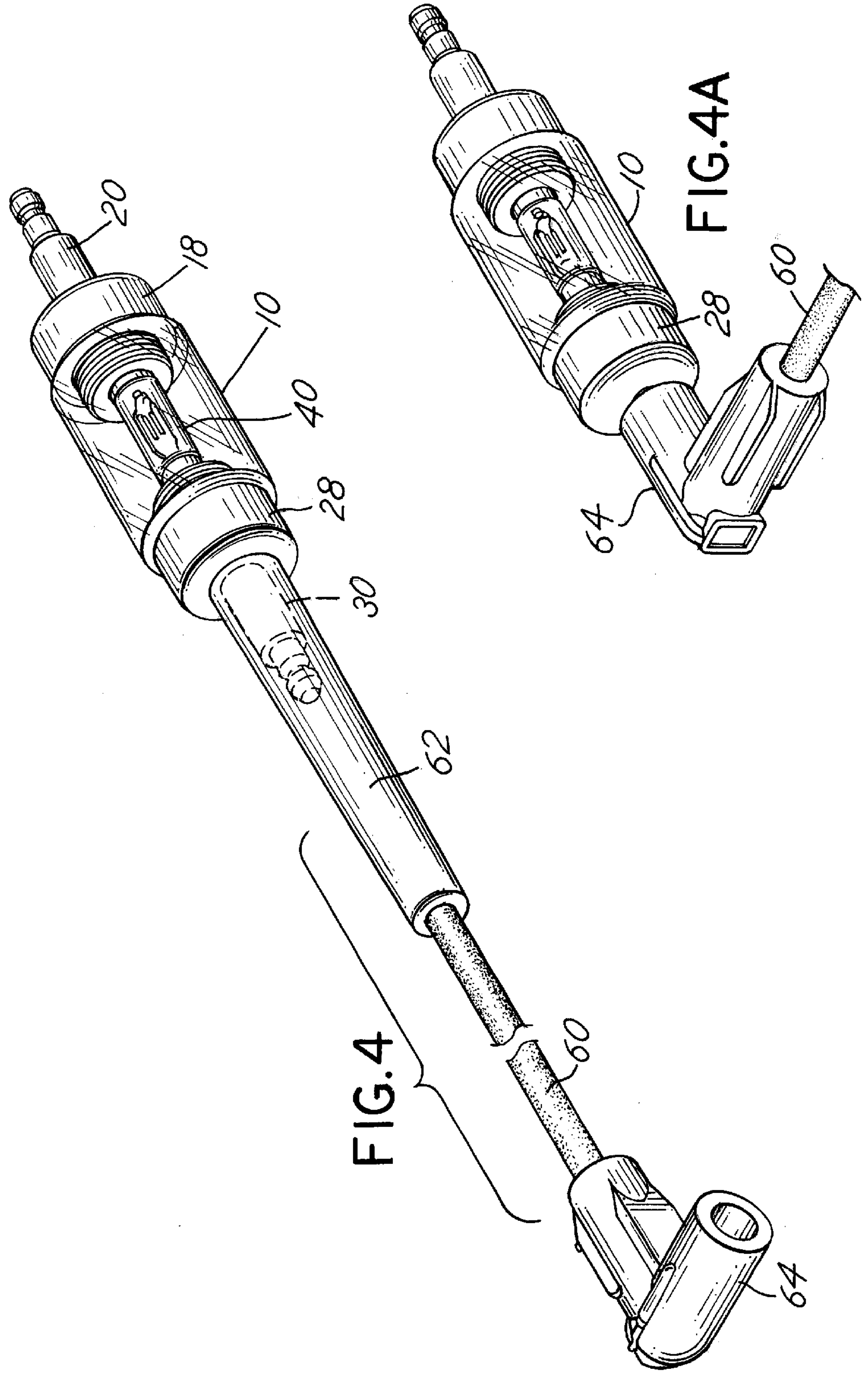
FIG. 4 is an isometric view of the tool of FIG. 3 in a first configuration.
FIG. 4A is an isometric view of the tool of FIG. 3 in an alternative configuration.
Figure 5:
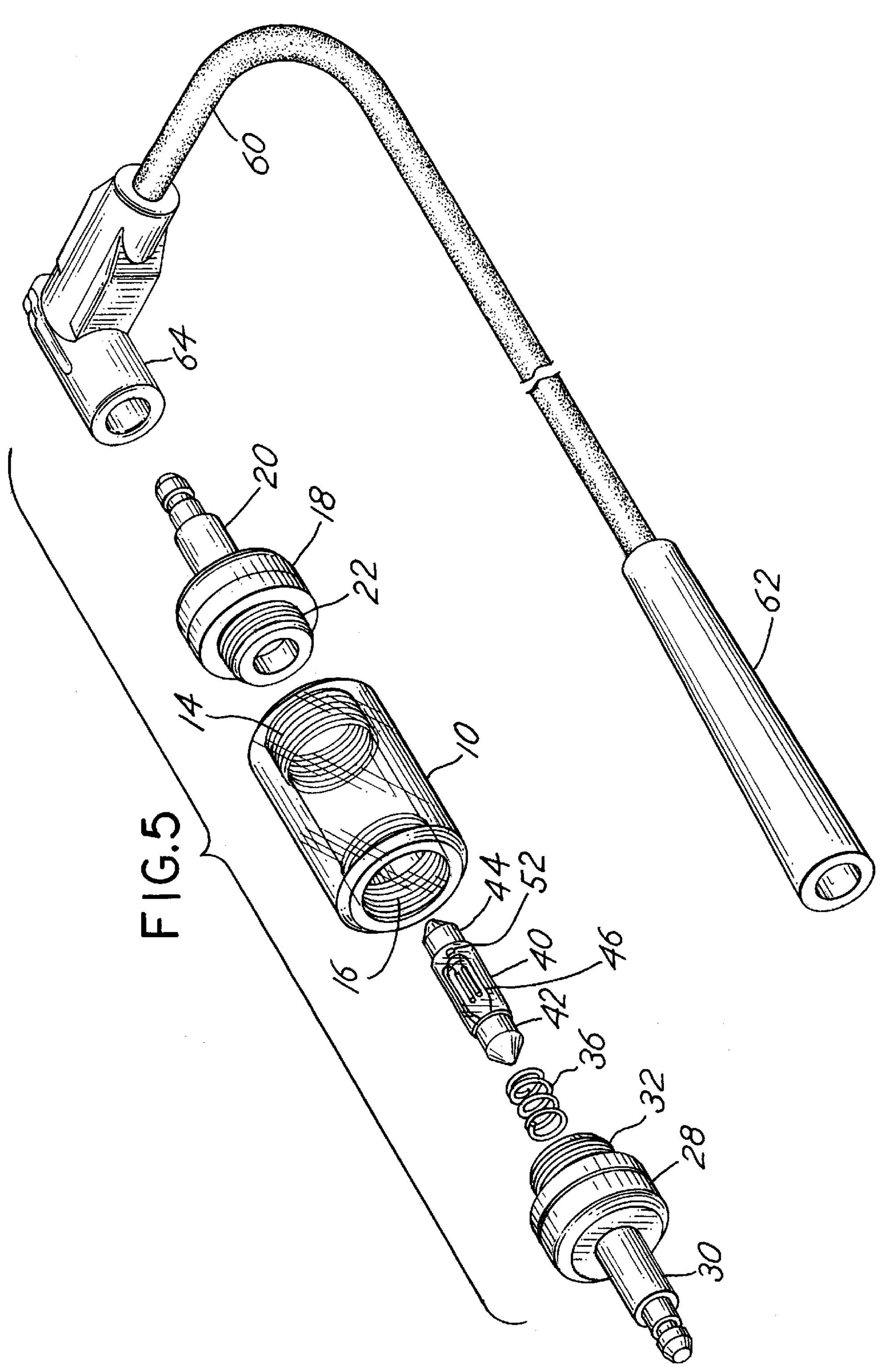
FIG. 5 is an exploded isometric view of the tool of FIG. 3.

Referring to FIGS. 2–6B, the ignition diagnostic tool includes a generally hollow, translucent or transparent cylindrical body member 10 with a cylindrical passage 12 of uniform diameter therethrough. Passage 12 includes a first threaded connection mechanism or internal threads 14 at one end and a second threaded connection mechanism or internal threads 16 at its opposite end. A first cap member 18 includes a projecting, conductive male rod 20. The cap 18 is molded from an insulating plastic material and includes a threaded annular ring or rib 22 which engages with the threaded connection or threads 14 of the body member 10 so as to tightly hold the cap 18 in position. The rod 20 is a conductive rod and is sized and shaped so as to cooperate with a spark plug ignition system boot. The rod 20 fits through the cap 18 and includes a contact pad or surface 24 positioned on the inside of the hollow body member 10.

A second cap 28 also includes a conductive rod 30 molded in the generally insulating material, second cap 28. The first rod 20 and second rod 30 are axially aligned one with the other and with a centerline axis 54 of the body member 10. The cap 28 also includes an annular ring member or rib 32 which is threaded and cooperative with the internal threads 16 of the body member 10. Rod 30 further includes an internal contact or pad 34 and, in addition, includes a spiral wound, conductive spring 36 either attached to the pad 34 or engaged against the pad 34.

A generally cylindrical bulb 40 includes frusto-conical metal end caps 42 and 44 which are also cylindrical and axially aligned to provide contact with the spring 36 and connection pad 24, respectively. The bulb 40 further includes a neon glow lamp 46 having lead wires 48 and 50 extending into the glow lamp 46. A resistor 52 is provided in the circuit connected with the glow lamp 46 through the lead 50.

The body member 10, in combination with the cap members or caps 18 and 28, provides a generally symmetrical device having conductive rods 20 and 30 projecting outwardly from the opposite ends thereof with the entire device being axially and symmetrically arranged along the axis 54. The body member 10 is cylindrical so that it may be easily, manually grasped and manipulated.

As a further important part of the combination comprising the apparatus, there is included a spark plug wire 60 which comprises an insulated wire connected with a first inline female boot member 62 and a second 90° angle boot member 64. The boot members 62, 64 are attached to the opposite ends of the wire 60. Each boot member 62, 64 is connectable to either one of the conductive rods 20 and 30.

Figure 6A:
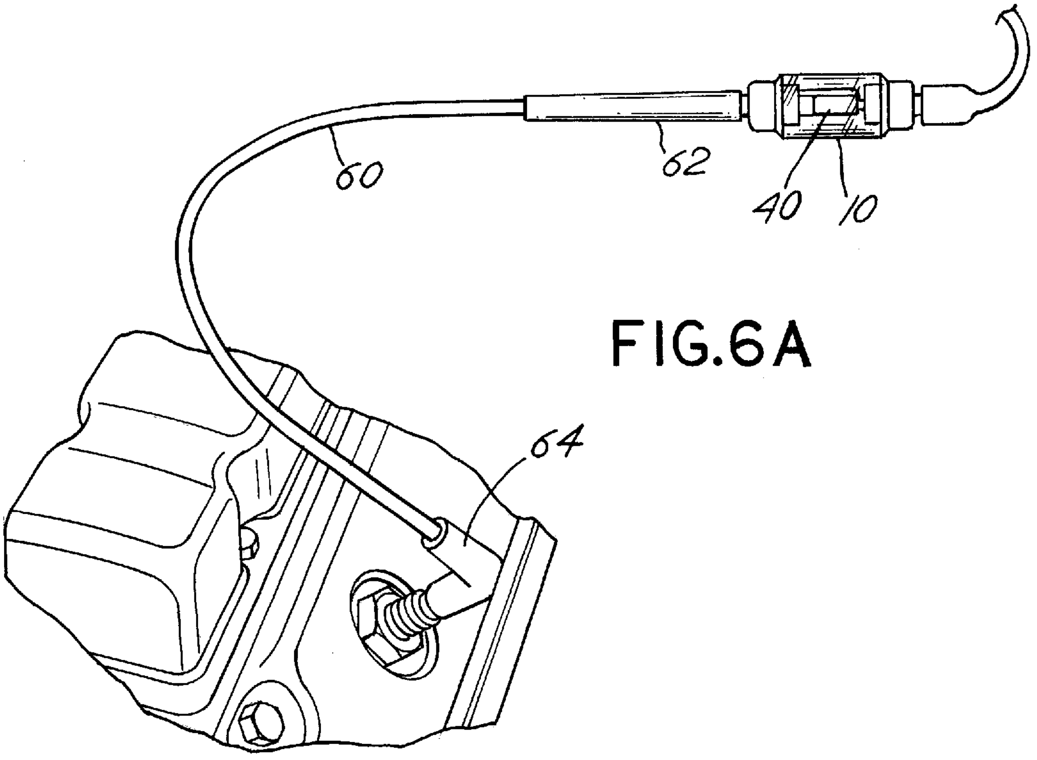
FIG. 6A is an isometric view illustrating the manner of use of the tool of FIG. 3.
Figure 6B:
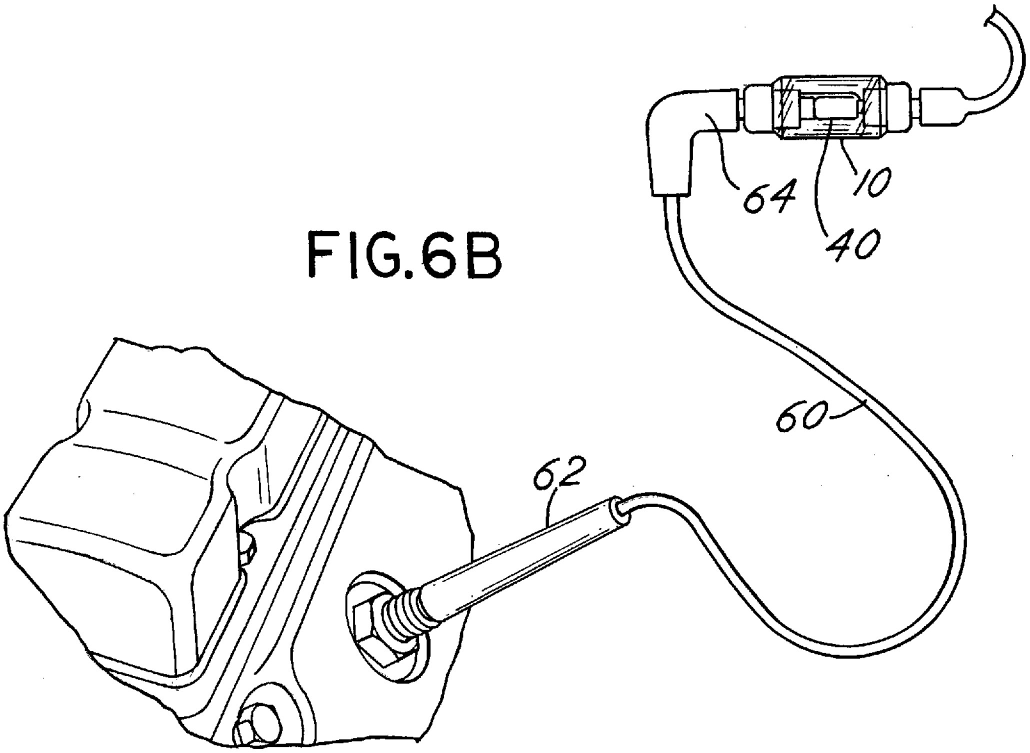
FIG. 6B is an isometric view illustrating the manner of use of the tool of FIG. 3 in an alternative configuration.

In practice, referring to FIGS. 6A and 6B, the wire 60, and more particularly, one of the boot members 62 or 64, may be engaged with the head 70 of a spark plug 72 in an engine block 74. The choice of the particular boot member 62 or 64 which will be utilized depends upon the orientation and position of the plug 72 and, more particularly, the head 70 thereof. In any event, the head 70 is connected electrically with the boot 62, 64 of choice. The opposite or remaining boot 62 or 64 is then connected to the rod 20 or 30 as the case may be. The remaining rod, 20 or 30, as the case may be, is connected to the boot 80 associated with the lead wire 82 that generally connects with the head 70 of the plug 72. Turning the ignition of the vehicle engine will then theoretically provide for electric current through the ignition system. If current is, in fact, being delivered, it will register via lighting of the bulb 46. If there is no ignition detection, then there is a fault with the ignition system, at least for that particular plug to the engine. If the ignition system does properly work, then failure of the particular cylinder to be operable is in all likelihood associated with the fuel delivery system.

With the tool of the invention, it is thus possible by virtue of utilizing a single tool to check each and every spark plug utilizing either the boot 62 or the boot 64 to connect to the plug depending upon the orientation and location of the plug. A separate tool is not needed. This results because the boots 62 and 64 are universally engageable with the rods 20 or 30, as well as the spark plug heads. A single tool can, therefore, be utilized in place of what previously would require two separate tools.

Various modifications and changes may be made to the described tool. For example, the shape and configuration of the body 10 may be altered. The indicator of electrical continuity may be altered and, for example, a light emitting dial or some other indicator device may be used. The particular arrangement of the mechanism for maintaining the elements within the hollow body may also be altered. That is, multiple springs may be utilized, or the springs may be eliminated, provided there is appropriate electrical continuity. Thus, the invention is to be limited only by the following claims and equivalents thereof.

What is claimed is:

1. Apparatus for testing the continuity of the ignition system of an internal combustion engine comprising in combination:

a translucent, hollow body member having a longitudinal axis extending between a first connection end thereof and a second, longitudinally spaced connection end thereof which is axially aligned with the first end, each connection end including a connection mechanism;

a first cap assembly comprising a first cap, a first axial, conductive male contact rod extending from the first cap, a first contact on the inside of the first cap connected to the rod, a conductive spring member engaging the contact in axial alignment therewith and a first connection mechanism compatible with the body connection mechanism of the first end of the body member;

a second cap assembly comprising a second cap, a second axial, conductive male contact rod extending from the second cap, a second contact on the inside of the second cap connected to the second rod, and a second connection mechanism compatible with the body connection mechanism of the second end of the body member;

an indicator bulb responsive to an electric spark activated circuit, said bulb axially aligned and electrically connected between the spring and the second contact; and a separate lead wire having a first, inline axially extending female boot connector at one end for attachment to a contact rod of one of said caps and a second angled female boot connector at the opposite end for attachment to a contact rod of one of said caps, each of said lead wire connectors being attachable to a spark plug male connector.

2. The apparatus of claim 1 wherein the body member is cylindrical and substantially transparent.

3. The apparatus of claim 1 wherein the second female angle boot connector is a right angle boot connector.

4. The apparatus of claim 1 wherein the light bulb includes two spaced leads and is filled with an electric spark activated gas.

5. The apparatus of claim 1 wherein the connection mechanisms comprise threaded connections.

* * * * *